United States Patent [19]
Nagaraj

[11] Patent Number: 5,861,832
[45] Date of Patent: Jan. 19, 1999

[54] ANALOG-TO-DIGITAL CONVERTER HAVING AMPLIFIER AND COMPARATOR STAGES

[75] Inventor: Krishnaswamy Nagaraj, Somerset, N.J.

[73] Assignee: Lucent Technologies Inc., Murray Hill, N.J.

[21] Appl. No.: 826,414

[22] Filed: Mar. 27, 1997

[51] Int. Cl.$^6$ .................................................. H03M 1/42
[52] U.S. Cl. ........................................ 341/161; 341/162
[58] Field of Search ................................... 341/161, 162, 341/163

[56] References Cited

U.S. PATENT DOCUMENTS

| | | | |
|---|---|---|---|
| 3,577,139 | 5/1971 | Foerster | 341/161 |
| 5,212,486 | 5/1993 | Nagaraj | 341/172 |
| 5,274,377 | 12/1993 | Matsuura et al. | 341/161 |
| 5,283,583 | 2/1994 | Ichihara | 341/162 |
| 5,541,602 | 7/1996 | Opris et al. | 341/161 |
| 5,710,563 | 1/1998 | Vu et al. | 341/161 |

OTHER PUBLICATIONS

"Efficient Circuit Configurations for Algorithmic Analog to Digital Converters", by Krishnaswami Nagaraj, IEEE Transactions on Circuits and Systems–II: Analog and Digital Signal Processing, vol. 40, No. 12, Dec. 1993, pp. 777–785.

"A 10–b 20–Msample / s Analog–to–Digital Converter", by Stephen H. Lewis et al., IEEE Journal of Solid–State Circuits, vol. 27. No. 3 Mar. 1992, pp. 351–358.

All –MOS Charge Redistribution Analog–to–Digital Conversion Techniques–Part 1, James L. McCreary and Paul R. Gray, IEEE Journal of Solid–State Circuits, vol. SC–10, No. 6, Dec. 1975, pp. 371–379.

*Primary Examiner*—Marc S. Hoff

[57] ABSTRACT

The first amplifier stage in the A/D converter receives an analog input signal and generates an analog residue signal and a digital output signal. Any other amplifier stage in the A/D converter receives the analog residue signal and the digital output signal from the previous amplifier stage, and generates another analog residue signal and another digital output signal. The comparator stage receives the analog residue signal and the digital output signal from the last amplifier stage, and generates one or more additional digital output signals. The digital output signals from all of the stages are used to generate the digitized equivalent of the original analog input signal. Because the comparator stage can be designed without an amplifier, the total number of amplifiers required to implement the A/D converter is reduced, as compared to prior art techniques.

20 Claims, 5 Drawing Sheets

ANALOG-TO-DIGITAL CONVERTER HAVING AMPLIFIER AND COMPARATOR STAGES

BACKGROUND OF THE INVENTION

This patent application is being filed concurrently with U.S. patent application Ser. No. 08/828,977, entitled "Amplifier for Use in Analog-to-Digital Signal Conversion," by Krishnaswamy Nagaraj (Attorney Docket No. "Nagaraj 16"), assigned to the same assignee and herein incorporated by reference.

1. Field of the Invention

The present invention is related to electrical circuits, and, in particular, to pipelined analog-to-digital converters.

2. Description of the Related Art

Pipelined analog-to-digital (A/D) converters are very commonly used in high-speed data converters. For example, a switched-capacitor algorithmic pipelined A/D converter is described in Lewis et al., "A 10-b 20-Msample/s Analog-to-Digital Converter," *IEEE Journal of Solid-State Circuits*, Vol. 27, No. 3, pp. 351–358, March 1992, the teachings of which are incorporated herein by reference. Such a converter employs a pipeline of N–1 stages for an N-bit converter, where each stage comprises an analog arithmetic unit followed by a two-level decision circuit and the analog arithmetic unit operation is performed by using a switched-capacitor network and an operational amplifier. The first stage accepts the analog input and produces a pair of decision bits (containing the equivalent of 1.5 binary bits of information) and an analog residue. These are passed on to the second stage, which treats the analog residue as its input and produces another 1.5 bits of information, as well as a new analog residue. This process continues until the residue reaches the last stage. The decision bits from all the stages represent a total of 1.5(N–1) bits of information. This means that redundancy exists within the bits of information. These are processed by a digital correction block that removes the redundancy and produces the final N-bit output. Any decision errors are corrected in this process.

Nagaraj, "Efficient Circuit Configurations For Algorithmic Analog-To-Digital Converters," *IEEE Transactions On Circuits Systems-II: Analog and Digital Signal Processing*, Vol. 40, No. 2, December, 1993, pp. 777–785 ("the Nagaraj article"), herein incorporated by reference, describes an A/D converter in which each amplifier is time-shared between two stages of the A/D converter, thereby reducing the total number of amplifiers used in such an A/D converter by a factor of two. For example, for a 10-bit pipelined A/D converter, five amplifiers are employed using the technique described in the Nagaraj article.

Despite the time-sharing technique for reducing the number of amplifiers, it is nonetheless desirable to continue to come up with approaches in which the number of amplifiers for an A/D converter may be further reduced. This is largely because such amplifiers typically employ significant chip area (for solid-state implementations) and consume significant amounts of power, and therefore increase the cost of the A/D converter. Thus, a need exists for other techniques for reducing the number of amplifiers employed in an A/D converter, such as a pipelined A/D converter, without reducing the number of bits the A/D converter can process.

Further aspects and advantages of this invention will become apparent from the detailed description which follows.

SUMMARY OF THE INVENTION

Embodiments of the present invention are directed to analog-to-digital converters having both one or more amplifier-based stages and a comparator-based stage.

According to one embodiment, an A/D converter comprises an amplifier stage and a comparator stage, wherein the amplifier stage is adapted to receive an analog signal and to generate an analog residue signal and the comparator stage is adapted to receive the analog residue signal from the amplifier stage and to generate a digital output signal.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

Figure 1:
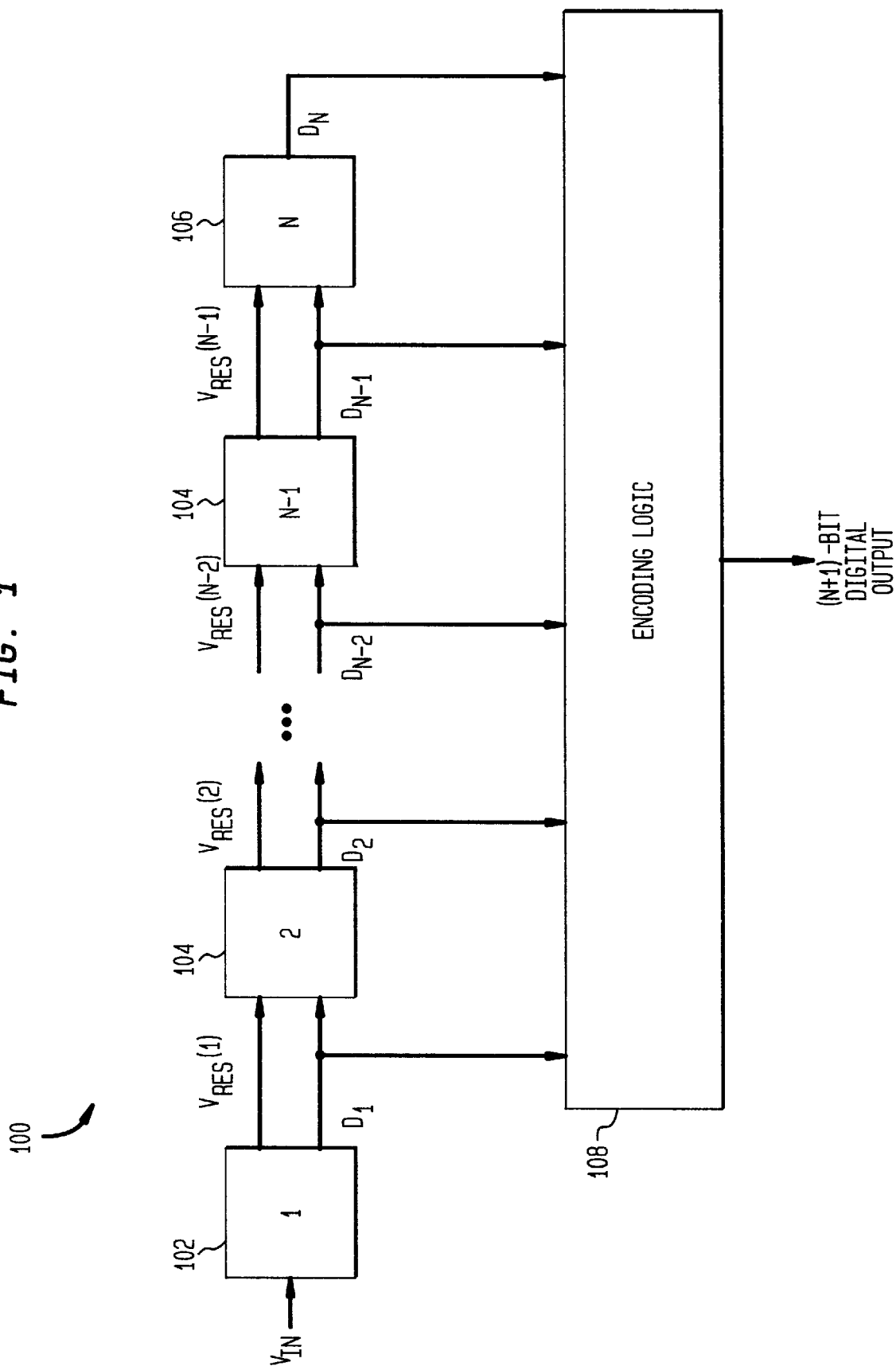
FIG. 1 shows a block diagram of a pipelined analog-to-digital converter, according to one embodiment of the present invention.

FIG. 1 shows a block diagram of a pipelined analog-to-digital converter 100, according to one embodiment of the present invention. AID converter 100 is an N-stage converter that converts an analog input signal $V_{IN}$ into an (N+1)-bit digital output signal. In one implementation, A/D converter 100 has three different types of stages: initial stage 102 (Stage 1), intermediate stages 104 (Stages 2 through N–1), and final stage 106 (Stage N).

Initial stage 102 receives the analog input signal $V_{IN}$ and generates two output signals: an analog residue signal $V_{RES}$(1) and a two-bit (one-of-three) digital output signal $D_1$. The $j^{th}$ intermediate stage 104 receives the two output signals generated by the previous stage (i.e., the analog residue signal $V_{RES}$(j–1) and the two-bit digital output signal $D_{j-1}$) and generates two output signals: an analog residue signal $V_{RES}$(j) and a two-bit digital output signal $D_j$. The final stage 106 receives the two output signals from the (N–1)$^{th}$ stage (i.e., the analog residue signal $V_{RES}$(N–1) and the two-bit digital output signal $D_{N-1}$) and generates a two-bit digital output signal $D_N$.

For each analog input signal $V_{IN}$, encoding logic 108 receives N two-bit digital output signals ($D_1, \ldots, D_N$) from the N stages. Those skilled in the art will understand that each two-bit digital output signal corresponds to 1.5 bits of information. Encoding logic 108 applies error-correction logic processing to the N two-bit digital output signals to remove redundancy and generate the (N+1)-bit digital equivalent to $V_{IN}$.

This approach to A/D conversion is described generally in the Nagaraj article. In alternative implementations, each stage of an A/D converter of the present invention may generate a digital output signal having other than two bits (i.e., one bit or more than two bits).

A/D converter 100 may be operated in a pipelined manner. Consider the sequence of analog input signals ($V_{INA}, V_{INB}, V_{INC}, V_{IND}, \ldots$), where $V_{INA}$ is the first input, $V_{INB}$ is the second input, and so forth. A/D converter 100 may be used to digitize that sequence in the following steps:

Step (1): Stage 1 receives $V_{INA}$ and generates $V_{RES}(1)$ and $D_1$ for $V_{INA}$.

Step (2): While Stage 2 receives $V_{RES}(1)$ and $D_1$ for $V_{INA}$ and generates $V_{RES}(2)$ and $D_2$ for $V_{INA}$, Stage 1 receives $V_{INB}$ and generates $V_{RES}(1)$ and $D_1$ for $V_{INB}$.

Step (3): While Stage 3 receives $V_{RES}(2)$ and $D_2$ for $V_{INA}$ and generates $V_{RES}(3)$ and $D_3$ for $V_{INA}$, and while Stage 2 receives $V_{RES}(1)$ and $D_1$ for $V_{INB}$ and generates $V_{RES}(2)$ and $D_2$ for $V_{INB}$, Stage 1 receives $V_{INC}$ and generates $V_{RES}(1)$ and $D_1$ for $V_{INC}$.

Step (4): While Stage 4 receives $V_{RES}(3)$ and $D_3$ for $V_{INA}$ and generates $V_{RES}(4)$ and $D_4$ for $V_{INA}$, and while Stage 3 receives $V_{RES}(2)$ and $D_2$ for $V_{INB}$ and generates $V_{RES}(3)$ and $D_3$ for $V_{INB}$, and while Stage 2 receives $V_{RES}(1)$ and $D_1$ for $V_{INC}$ and generates $V_{RES}(2)$ and $D_2$ for $V_{INC}$, Stage 1 receives $V_{IND}$ and generates $V_{RES}(1)$ and $D_1$ for $V_{IND}$.

Step (5): etc.

In this way, A/D converter 100 can efficiently convert a sequence of analog input signals $V_{IN}$ into a sequence of (N+1)-bit digital output signals. It will be understood, of course, that A/D converter 100 can be operated to convert analog input signals into digital output signals one at a time in a non-pipelined manner.

Figure 2:
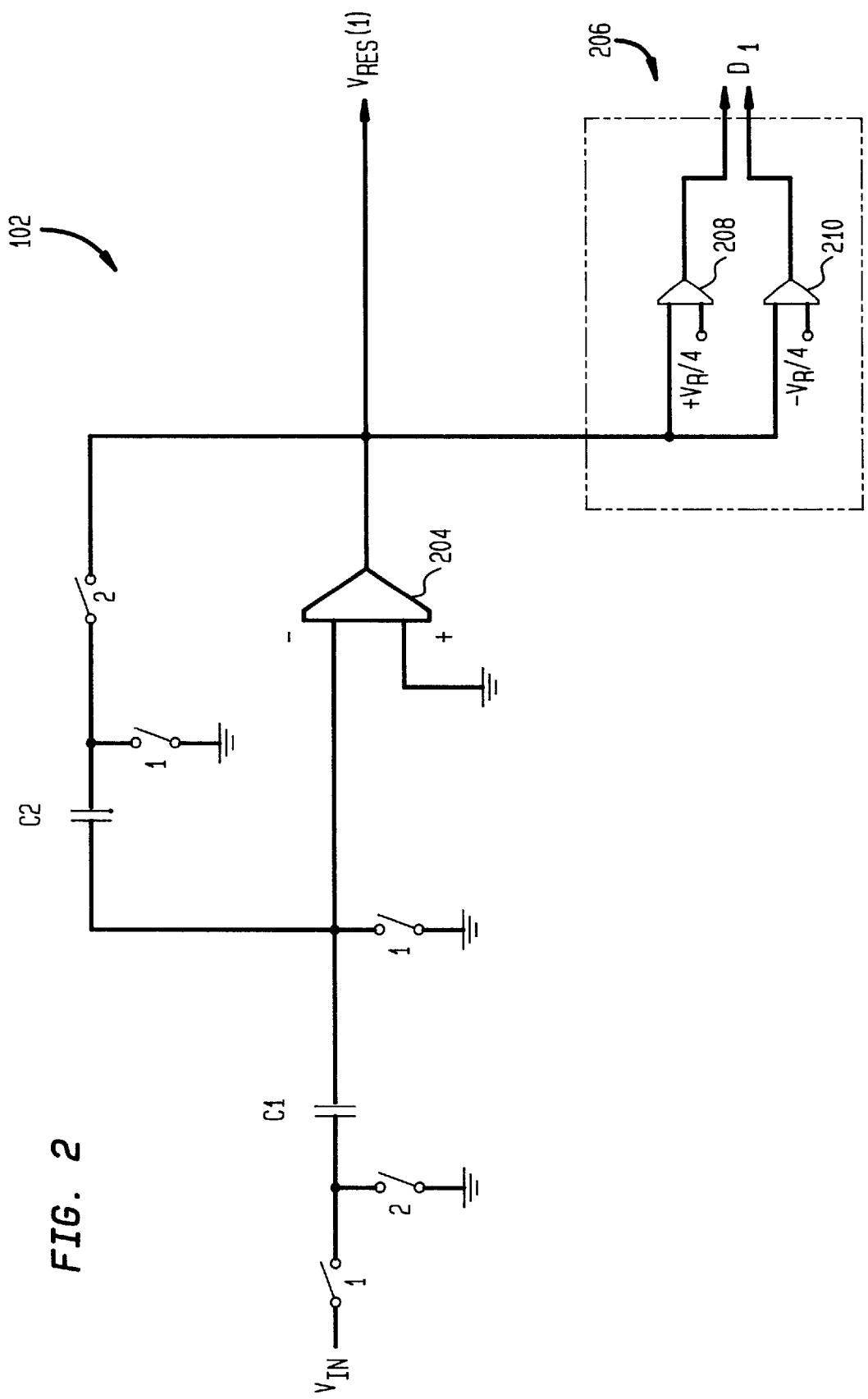
FIG. 2 shows a schematic diagram of the initial stage of the A/D converter of FIG. 1.

FIG. 2 shows a schematic diagram of initial stage 102 of A/D converter 100 of FIG. 1, according to one embodiment of the present invention. Initial stage 102 receives the analog input signal $V_{IN}$ and generates the first analog residue signal $V_{RES}(1)$ and the first two-bit digital output signal $D_1$. Initial stage 102 may be a conventional sample-and-hold circuit. In one implementation, the analog residue signal $V_{RES}(1)$ generated by initial stage 102 is approximately equal to the original analog input signal $V_{IN}$.

Initial stage 102 has two clock phases of operation. During the first clock phase, switches 1 are closed and switches 2 are opened. During this first clock phase, capacitor C1 samples $V_{IN}$. During the second clock phase, switches 1 are opened and switches 2 are closed. During this second clock phase, amplifier 204 generates $V_{RES}(1)$ based on the signal stored in capacitor C1. Within decision circuit 206, comparators 208 and 210 compare the residue signal $V_{RES}(1)$ to the reference signals $+V_R/4$ and $-V_R/4$, respectively, to generate the two-bit digital output signal $D_1$.

Figure 3:
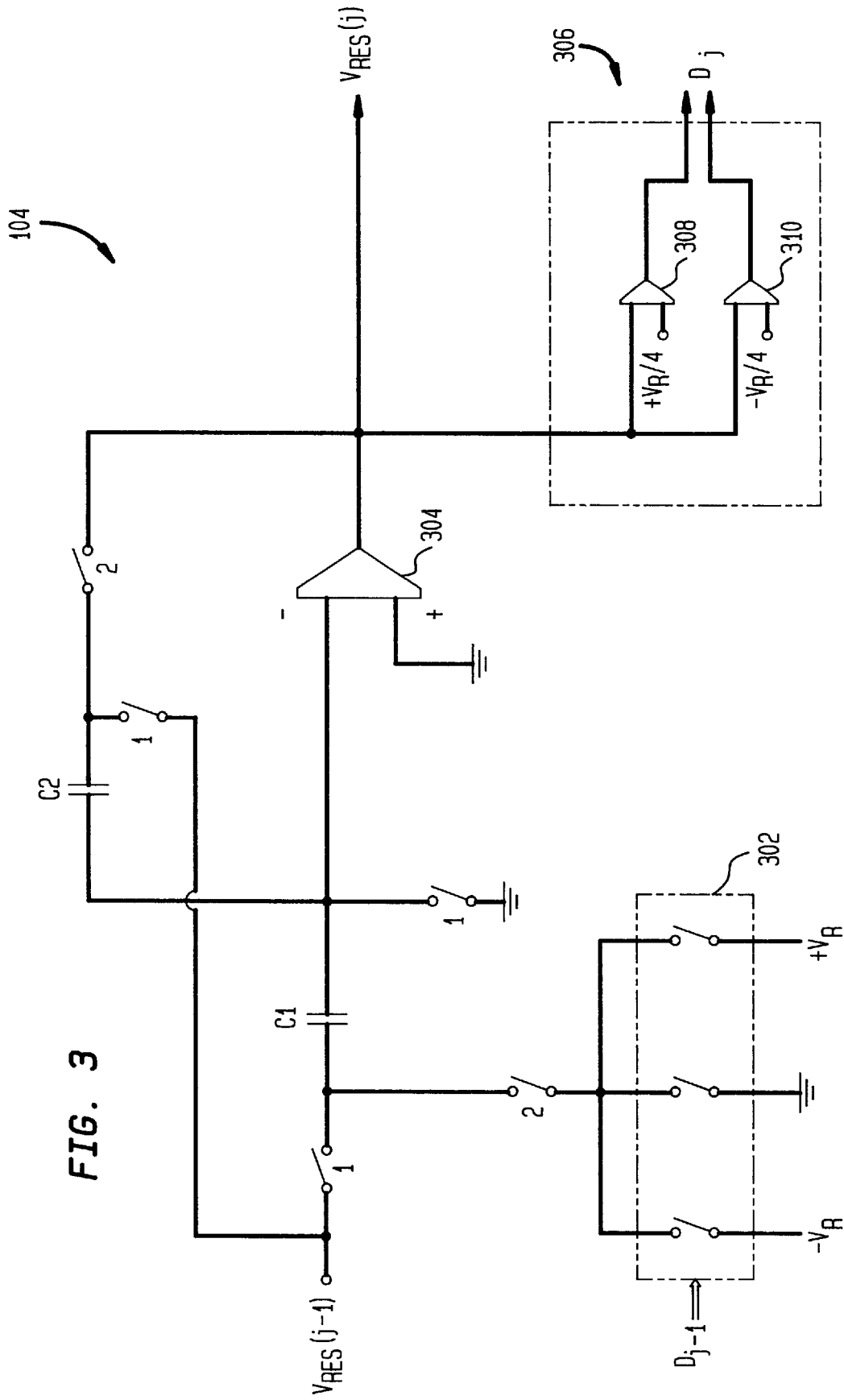
FIG. 3 shows a schematic diagram of each intermediate stage of the A/D converter of FIG. 1.

FIG. 3 shows a schematic diagram of each intermediate stage 104 of A/D converter 100 of FIG. 1, according to one embodiment of the present invention. In general, the $j^{th}$ intermediate stage 104 receives analog residue signal $V_{RES}(j-1)$ and digital output signal $D_{j-1}$ from the previous stage of A/D converter 100 and generates analog residue signal $V_{RES}(j)$ and digital output signal $D_j$.

Like initial stage 102 of FIG. 2, intermediate stage 104 has two clock phases of operation. During the first clock phase, switches 1 are closed and switches 2 are opened. During this first clock phase, capacitors C1 and C2 simultaneously sample $V_{RES}(j)$ as received from the previous stage. During the second clock phase, switches 1 are opened and switches 2 are closed. During this second clock phase, a reference signal generated by reference generator 302 is applied to capacitor C1 and amplifier 304 generates $V_{RES}(j)$ according to Equation (1) as follows:

$$V_{RES}(j) = 2\ V_{RES}(j-1) - D_{j-1} V_R \quad (1)$$

where $V_R$ is the maximum allowable input voltage. Those skilled in the art will recognize that Equation (1) is typically applied in successive approximation A/D conversion. Reference generator 302 selects which reference signal to apply to capacitor C1 based on the two-bit digital value $D_{j-1}$, as follows:

If $D_{j-1} = -1$ (corresponding to the two-bit value (00)), then reference generator 302 selects $-V_R$ as the reference signal;

If $D_{j-1} = 0$ (corresponding to the two-bit value (01)), then reference generator 302 selects ground as the reference signal; and If $D_{j-1} = +1$ (corresponding to the two-bit value (11)), then reference generator 302 selects $+V_R$ as the reference signal.

Within decision circuit 306, comparators 308 and 310 compare the new residue signal $V_{RES}(j)$ to the reference signals $+V_R/4$ and $-V_R/4$, respectively, to generate the new two-bit digital output signal $D_j$.

Figure 4:
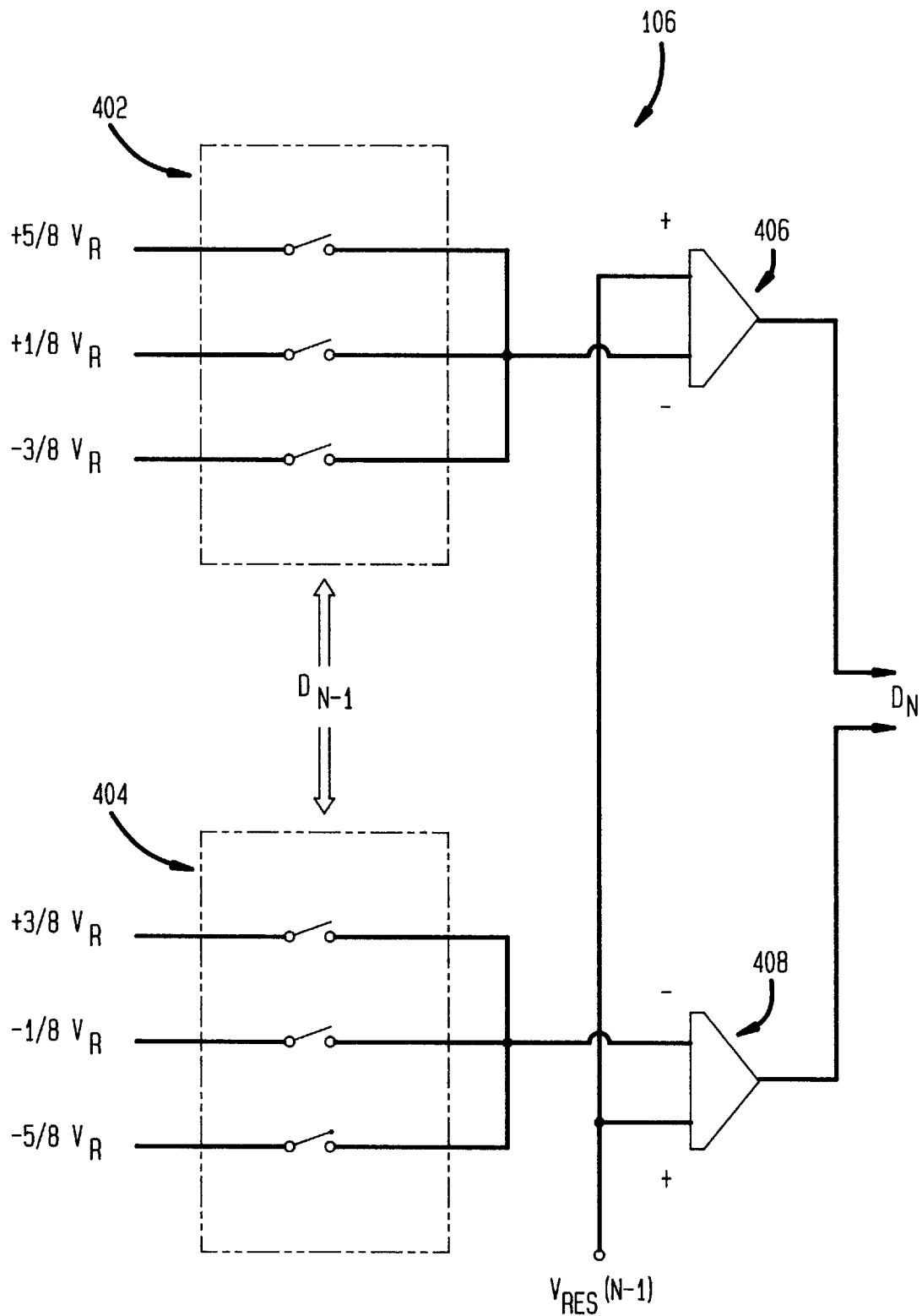
FIG. 4 shows a schematic diagram of the final stage of the A/D converter of FIG. 1.

FIG. 4 shows a schematic diagram of final stage 106 of A/D converter 100 of FIG. 1, according to one embodiment of the present invention. Final stage 106 receives analog residue signal $V_{RES}(N-1)$ and digital output signal $D_{N-1}$ from the second-to-last stage (i.e., Stage N-1 of FIG. 1), and generates the final two-bit digital output signal $D_N$.

Referring again to intermediate stage 104 of FIG. 3, the two-bit digital output signal is generated by (a) generating $V_{RES}(j)$, according to Equation (1), as $(2\ V_{RES}(j-1) - D_{j-1} V_R)$ and then (b) comparing $V_{RES}(j)$ to $+V_R/4$ and $-V_R/4$. These operation are equivalent to comparing the signal $(V_{RES}(j-1) - D_{j-1} V_R/2)$ to $+V_R/8$ and $-V_R/8$. This is what happens in final stage 106 in FIG. 4. In particular:

If $D_{N-1} = -1$, then reference generator 402 selects $+\frac{5}{8} V_R$ as the reference signal for comparator 406 and reference generator 404 selects $+\frac{3}{8} V_R$ as the reference signal for comparator 408;

If $D_{N-1} = 0$, then reference generator 402 selects $+\frac{1}{8} VR$ as the reference signal for comparator 406 and reference generator 404 selects $-\frac{1}{8} V_R$ as the reference signal for comparator 408; and If $D_{N-1} = +1$, then reference generator 402 selects $-\frac{3}{8} V_R$ as the reference signal for comparator 406 and reference generator 404 selects $-\frac{5}{8} V_R$ as the reference signal for comparator 408.

Comparators 406 and 408 compare the selected reference signals to $V_{RES}(N-1)$ in order to generate the two bits of $D_N$.

Since final stage 106 does not have to generate another analog residue signal since there are no more downstream stages, the design of final stage 106 does not rely on an amplifier. As such, A/D converter 100 of FIG. 1 can be designed with fewer amplifiers than even those A/D converters described in the Nagaraj article. For example, a 10-bit A/D converter having nine stages can be designed to have only four amplifiers: one time-shared amplifier for each of Stages 1 and 2, Stages 3 and 4, Stages 5 and 6, and Stages 7 and 8, with Stage 9 being implemented without an amplifier using the circuit of FIG. 4. This means that solid-state implementations of A/D converters of the present invention require less chip area and may therefore be less expensive to make.

Figure 5:
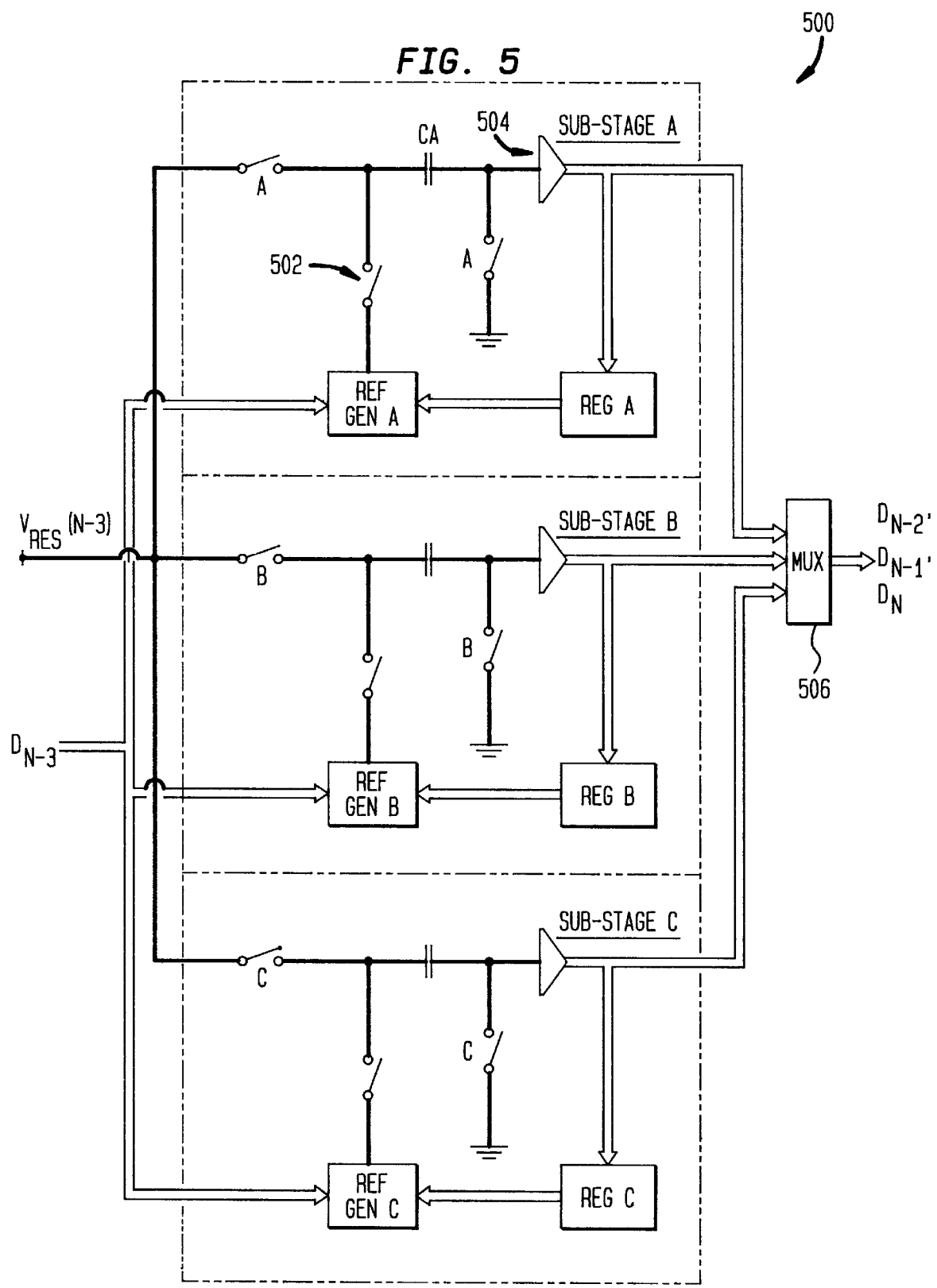
FIG. 5 shows a schematic diagram of a circuit that may be used to replace the last three stages of the AID converter of FIG. 1, according to an alternative embodiment of the present invention.

FIG. 5 shows a schematic diagram of circuit 500. In an alternative embodiment of the present invention, circuit 500 may be used to replace the last three stages of A/D converter 100 of FIG. 1 (i.e., Stages N-2, N-1, and N). For each original analog input signal $V_{IN}$, circuit 500 receives the analog residue signal $V_{RES}(N-3)$ and the two-bit digital output signal $D_{N-3}$ from Stage N-3, and sequentially generates three two-bit digital output signals (i.e., $D_{n-2}$, $D_{N-1}$, and $D_N$). Circuit 500 has three parallel sub-stages (Sub-Stages A, B, and C) that operate in analogous fashion.

In particular, referring, for example, to Sub-Stage A, when switches A are closed and switch 502 is opened, capacitor CA samples $V_{RES}(N-3)$ as received from previous Stage N–3. When switches A are opened and switch 502 is closed (for the first time), reference generator A applies a reference signal to capacitor CA and decision circuit 504 generates the two-bit digital output signal $D_{N-2}$. In a preferred embodiment, each sub-stage in circuit 500 has two sets of capacitors, reference generators, and decision circuits, which generate the two bits of $D_{N-2}$, analogous to the two sets of reference generators and decision circuits in FIG. 4. The two-bit digital output signal $D_{N-2}$ is transmitted to both multiplexer 506 and register A, which temporarily stores $D_{N-2}$.

With switch 502 remaining closed, when reference generator A receives $D_{N-2}$ from register A, it (potentially) changes the selected reference signal applied to capacitor CA and decision circuit 504 generates the next two-bit digital output signal $D_{N-1}$. This processing is repeated one more time to generate the last two-bit digital output signal $D_N$. Each time reference generator A applies a different reference signal to capacitor CA, the voltage applied to comparator 504 is altered. By selecting reference signals appropriately, the signal stored in capacitor CA can be altered to reflect the value of the previously resolved digital output signal. In general, for each successive digital output corresponding to a given input, the magnitudes of the reference voltages are decreased.

In order to be used in an A/D converter that can operate in a pipelined manner, circuit 500 is designed to have three parallel sub-stages (i.e., Sub-Stages A, B, and C of FIG. 5). These three parallel sub-stages are used to process simultaneously the last three bits of three consecutive analog input signals (e.g., $V_{INA}$, $V_{INB}$, and $V_{INC}$). In particular, circuit 500 can operate in a pipelined manner in the following steps:

Step (1): With switches A closed and switches B and C opened, Sub-Stage A samples $V_{RES}(N-3)$ and $D_{N-3}$ for the first analog input signal $V_{INA}$ and then generates the digital output signal $D_{N-2}$ for $V_{INA}$ for $V_{INA}$ (after switches A are opened and switch 502 is closed).

Step (2): With switches B closed and switches A and C opened, while Sub-Stage A generates $D_{N-1}$ for $V_{INA}$, Sub-Stage B samples $V_{RES}(N-3)$ and $D_{N-3}$ for the second analog input signal $V_{INB}$ and then generates the digital output signal $D_{N-2}$ for $V_{INB}$.

Step (3): With switches C closed and switches A and B opened, while Sub-Stage A generates $D_N$ for $V_{INA}$ and Sub-Stage B generates $D_{N-1}$ for $V_{INB}$, Sub-Stage C samples $V_{RES}(N-3)$ and $D_{N-3}$ for the third analog input signal $V_{INC}$ and then generates the digital output signal $D_{N-2}$ for $V_{INC}$.

Step (4): With switches A closed and switches B and C opened, while Sub-Stage B generates $D_N$ for $V_{INB}$ and Sub-Stage C generates $D_{N-1}$ for $V_{INC}$, Sub-Stage A samples $V_{RES}(N-3)$ and $D_{N-3}$ for the fourth analog input signal $V_{IND}$ and then generates the digital output signal $D_{N-2}$ for $V_{IND}$.

(5): etc. Mux 506 appropriately handles the distribution of the various digital output signals $D_{N-2}$, $D_{N-1}$, and $D_N$ corresponding to the various analog input signals $V_{IN}$, for example, to encoding logic 108 of FIG. 1.

In this way, circuit 500 supports efficient pipelined A/D conversion of a stream of analog input signals ($V_{INA}$, $V_{INB}$, $V_{INC}$, $V_{IND}$, . . . ). It will understood that alternative embodiments of circuit 500 can be designed with different numbers of parallel sub-stages to replace different numbers of stages in A/D converter 100 of FIG. 1. For example, a circuit consisting of only Sub-Stages A and B of FIG. 5 could be used to replace only Stages N–1 and N of A/D converter 100 of FIG. 1.

Circuit 500 of FIG. 5 can be used to replace yet another amplifier otherwise needed in A/D converter 100 of FIG. 1. For example, when circuit 500 of FIG. 5 is used to replace Stages 7, 8, and 9 of a 10-bit A/D converter, the resulting A/D converter requires only three amplifiers: one for each of Stages 1 and 2, Stages 3 and 4, and Stages 5 and 6. In general, for every two additional parallel sub-stages built into a circuit like circuit 500, another amplifier can be omitted from a time-sharing implementation of an A/D converter, such as that discussed in the Nagaraj article.

The number of stages of A/D converter 100 of FIG. 1 replaced by a circuit like circuit 500 of FIG. 5 and therefore the overall reduction in the number of amplifiers in A/D converter 100 may be limited by the accuracy requirements for the A/D converter. In general, the comparator-based scheme of circuit 500 of FIG. 5 and circuit 106 of FIG. 4 is less accurate (i.e., in resolving bits correctly) than the amplifier-based scheme of circuit 104 of FIG. 3. Thus, the accuracy requirements of the A/D converter will dictate (at least in part) the design of the last few stages of the A/D converter.

Those skilled in the art will understand that the present invention may be applied to A/D converters that employ the time-sharing technology, such as that described in the Nagaraj article, as well as to A/D converters that do not employ time-sharing technology.

Those skilled in the art will also understand that the present invention may be implemented as a single integrated circuit using solid-state technology or as a circuit having a plurality of discrete elements.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. An analog-to-digital (A/D) converter, comprising:
   (a) an amplifier-based initial stage adapted to receive an analog input signal and to generate a first analog residue signal and a first n-bit digital signal;
   (b) one or more amplifier-based intermediate stages, each adapted to receive an incoming analog residue signal and an incoming n-bit digital signal from the previous stage and to generate an outgoing analog residue signal and an outgoing n-bit digital signal; and
   (c) a non-amplifier-based final stage adapted to receive an incoming analog residue signal and an incoming n-bit digital signal from the previous stage and to generate two or more outgoing n-bit digital signals.

2. The invention of claim 1, wherein the final stage comprises one or more sub-stages, each sub-stage comprising:
   (1) a non-amplifier-based sample-and-hold circuit adapted to sample and hold the incoming analog residue signal as a stored analog residue signal;
   (2) a reference generator adapted to generate one or more reference signals based on a digital signal, wherein the one or more reference signals are selectively applied to the stored analog residue signal in the sample-and-hold circuit; and
   (3) a decision circuit adapted to generate an outgoing digital signal based on the stored analog residue signal after application of the one or more reference signals, wherein:

the reference generator generates a first set of one or more reference signals based on the incoming digital signal from the previous stage;

the first set of one or more reference signals is applied to the stored analog residue signal in the sample-and-hold circuit;

the decision circuit generates a first outgoing digital signal based on the stored analog residue signal after application of the first set of one or more reference signals;

the reference generator generates a second set of one or more reference signals based on the first outgoing digital signal;

the second set of one or more reference signals is applied to the stored analog residue signal in the sample-and-hold circuit; and the decision circuit generates a second outgoing digital signal based on the stored analog residue signal after application of the second set of one or more reference signals.

3. The invention of claim 2, wherein the final stage comprises two or more parallel sub-stages to support pipelined A/D conversion processing, wherein each sub-stage generates two or more outgoing digital signals corresponding to a different analog input signal.

4. The invention of claim 2, wherein each sample-and-hold circuit comprises one or more capacitors and a set of switches to control (i) the sampling and holding of the incoming analog residue signal by the one or more capacitors and (ii) the application of the one or more reference signals to the stored analog residue signals held in the one or more capacitors.

5. The invention of claim 2, wherein each sub-stage further comprises a register to store an outgoing digital signal generated by the decision circuit for use by the reference generator in generating another set of one or more reference signals used to generate another outgoing digital signal.

6. The invention of claim 2, wherein, in each sub-stage:

the sample-and-hold circuit comprises two capacitors;

the reference generator generates two reference signals, each of which is applied to a different one of the two capacitors; and the decision circuit comprises two comparators and each outgoing digital signal is a 2-bit digital signal.

7. The invention of claim 1, wherein:

the initial stage uses (i) an amplifier-based sample-and-hold circuit to generate the first analog residue signal from the analog input signal and (ii) a decision circuit to generate the first digital signal from the first analog residue signal; and each intermediate stage uses (i) an amplifier-based sample-and-hold circuit to generate its outgoing analog residue signal from the incoming analog residue signal and the incoming digital signal from the previous stage and (ii) a decision circuit to generate its outgoing digital signal from its outgoing analog residue signal.

8. The invention of claim 7, wherein each of one or more pairs of initial and intermediate stages time-share the amplifier of a sample-and-hold circuit.

9. The invention of claim 7, wherein the sample-and-hold circuit for each intermediate stage comprises a reference generator that generates a reference signal based on the incoming digital signal from the previous stage, wherein the reference signal is used to generate the outgoing analog residue signal.

10. The invention of claim 7, wherein each decision circuit generates a 2-bit outgoing digital signal.

11. The invention of claim 1, wherein:

the final stage comprises one or more sub-stages, each sub-stage comprising:

(1) a non-amplifier-based sample-and-hold circuit adapted to sample and hold the incoming analog residue signal as a stored analog residue signal;

(2) a reference generator adapted to generate one or more reference signals based on a digital signal, wherein the one or more reference signals are selectively applied to the stored analog residue signal in the sample-and-hold circuit; and (3) a decision circuit adapted to generate an outgoing digital signal based on the stored analog residue signal after application of the one or more reference signals, wherein:

the reference generator generates a first set of one or more reference signals based on the incoming digital signal from the previous stage;

the first set of one or more reference signals is applied to the stored analog residue signal in the sample-and-hold circuit;

the decision circuit generates a first outgoing digital signal based on the stored analog residue signal after application of the first set of one or more reference signals;

the reference generator generates a second set of one or more reference signals based on the first outgoing digital signal;

the second set of one or more reference signals is applied to the stored analog residue signal in the sample-and-hold circuit; and the decision circuit generates a second outgoing digital signal based on the stored analog residue signal after application of the second set of one or more reference signals;

the final stage comprises two or more parallel sub-stages to support pipelined A/D conversion processing, wherein each sub-stage generates two or more outgoing digital signals corresponding to a different analog input signal;

each sample-and-hold circuit comprises one or more capacitors and a set of switches to control (i) the sampling and holding of the incoming analog residue signal by the one or more capacitors and (ii) the application of the one or more reference signals to the stored analog residue signals held in the one or more capacitors;

each sub-stage further comprises a register to store an outgoing digital signal generated by the decision circuit for use by the reference generator in generating another set of one or more reference signals used to generate another outgoing digital signal;

in each sub-stage:

the sample-and-hold circuit comprises two capacitors;

the reference generator generates two reference signals, each of which is applied to a different one of the two capacitors; and the decision circuit comprises two comparators and each outgoing digital signal is a 2-bit digital signal;

the initial stage uses (i) an amplifier-based sample-and-hold circuit to generate the first analog residue signal from the analog input signal and (ii) a decision circuit to generate the first digital signal from the first analog residue signal;

each intermediate stage uses (i) an amplifier-based sample-and-hold circuit to generate its outgoing analog residue signal from the incoming analog residue signal and the incoming digital signal from the previous stage and (ii) a decision circuit to generate its outgoing digital signal from its outgoing analog residue signal;

each of one or more pairs of initial and intermediate stages time-share the amplifier of a sample-and-hold circuit;

the sample-and-hold circuit for each intermediate stage comprises a reference generator that generates a reference signal based on the incoming digital signal from the previous stage, wherein the reference signal is used to generate the outgoing analog residue signal; and each decision circuit for the initial and intermediate stages generates a 2-bit outgoing digital signal.

12. An integrated circuit having an A/D converter, the A/D converter comprising:

(a) an amplifier-based initial stage adapted to receive an analog input signal and to generate a first analog residue signal and a first n-bit digital signal;

(b) one or more amplifier-based intermediate stages, each adapted to receive an incoming analog residue signal and an incoming n-bit digital signal from the previous stage and to generate an outgoing analog residue signal and an outgoing n-bit digital signal; and (c) a non-amplifier-based final stage adapted to receive an incoming analog residue signal and an incoming n-bit digital signal from the previous stage and to generate two or more outgoing n-bit digital signals.

13. The invention of claim 12, wherein the final stage comprises one or more sub-stages, each sub-stage comprising:

(1) a non-amplifier-based sample-and-hold circuit adapted to sample and hold the incoming analog residue signal as a stored analog residue signal;

(2) a reference generator adapted to generate one or more reference signals based on a digital signal, wherein the one or more reference signals are selectively applied to the stored analog residue signal in the sample-and-hold circuit; and (3) a decision circuit adapted to generate an outgoing digital signal based on the stored analog residue signal after application of the one or more reference signals, wherein:

the reference generator generates a first set of one or more reference signals based on the incoming digital signal from the previous stage;

the first set of one or more reference signals is applied to the stored analog residue signal in the sample-and-hold circuit;

the decision circuit generates a first outgoing digital signal based on the stored analog residue signal after application of the first set of one or more reference signals;

the reference generator generates a second set of one or more reference signals based on the first outgoing digital signal;

the second set of one or more reference signals is applied to the stored analog residue signal in the sample-and-hold circuit; and the decision circuit generates a second outgoing digital signal based on the stored analog residue signal after application of the second set of one or more reference signals.

14. The invention of claim 13, wherein the final stage comprises two or more parallel sub-stages to support pipelined A/D conversion processing, wherein each sub-stage generates two or more outgoing digital signals corresponding to a different analog input signal.

15. The invention of claim 13, wherein each sample-and-hold circuit comprises one or more capacitors and a set of switches to control (i) the sampling and holding of the incoming analog residue signal by the one or more capacitors and (ii) the application of the one or more reference signals to the stored analog residue signals held in the one or more capacitors.

16. The invention of claim 13, wherein each sub-stage further comprises a register to store an outgoing digital signal generated by the decision circuit for use by the reference generator in generating another set of one or more reference signals used to generate another outgoing digital signal.

17. The invention of claim 13, wherein, in each sub-stage:

the sample-and-hold circuit comprises two capacitors;

the reference generator generates two reference signals, each of which is applied to a different one of the two capacitors; and the decision circuit comprises two comparators and each outgoing digital signal is a 2-bit digital signal.

18. The invention of claim 12, wherein:

the initial stage uses (i) an amplifier-based sample-and-hold circuit to generate the first analog residue signal from the analog input signal and (ii) a decision circuit to generate the first digital signal from the first analog residue signal; and each intermediate stage uses (i) an amplifier-based sample-and-hold circuit to generate its outgoing analog residue signal from the incoming analog residue signal and the incoming digital signal from the previous stage and (ii) a decision circuit to generate its outgoing digital signal from its outgoing analog residue signal.

19. The invention of claim 18, wherein:

each of one or more pairs of initial and intermediate stages time-share the amplifier of a sample-and-hold circuit;

the sample-and-hold circuit for each intermediate stage comprises a reference generator that generates a reference signal based on the incoming digital signal from the previous stage, wherein the reference signal is used to generate the outgoing analog residue signal; and each decision circuit generates a 2-bit outgoing digital signal.

20. The invention of claim 19, wherein:

the final stage comprises one or more sub-stages, each sub-stage comprising:

(1) a non-amplifier-based sample-and-hold circuit adapted to sample and hold the incoming analog residue signal as a stored analog residue signal;

(2) a reference generator adapted to generate one or more reference signals based on a digital signal, wherein the one or more reference signals are selectively applied to the stored analog residue signal in the sample-and-hold circuit; and (3) a decision circuit adapted to generate an outgoing digital signal based on the stored analog residue signal after application of the one or more reference signals, wherein:

the reference generator generates a first set of one or more reference signals based on the incoming digital signal from the previous stage;

the first set of one or more reference signals is applied to the stored analog residue signal in the sample-and-hold circuit;

the decision circuit generates a first outgoing digital signal based on the stored analog residue signal after application of the first set of one or more reference signals;

the reference generator generates a second set of one or more reference signals based on the first outgoing digital signal;

the second set of one or more reference signals is applied to the stored analog residue signal in the sample-and-hold circuit; and the decision circuit generates a second outgoing digital signal based on the stored analog residue signal after application of the second set of one or more reference signals;

the final stage comprises two or more parallel sub-stages to support pipelined A/D conversion processing, wherein each sub-stage generates two or more outgoing digital signals corresponding to a different analog input signal;

each sample-and-hold circuit comprises one or more capacitors and a set of switches to control (i) the sampling and holding of the incoming analog residue signal by the one or more capacitors and (ii) the application of the one or more reference signals to the stored analog residue signals held in the one or more capacitors;

each sub-stage further comprises a register to store an outgoing digital signal generated by the decision circuit for use by the reference generator in generating another set of one or more reference signals used to generate another outgoing digital signal; and in each sub-stage:

the sample-and-hold circuit comprises two capacitors;

the reference generator generates two reference signals, each of which is applied to a different one of the two capacitors; and the decision circuit comprises two comparators and each outgoing digital signal is a 2-bit digital signal.

* * * * *